US011424104B2

(12) United States Patent
Collins et al.

(10) Patent No.: US 11,424,104 B2
(45) Date of Patent: Aug. 23, 2022

(54) PLASMA REACTOR WITH ELECTRODE FILAMENTS EXTENDING FROM CEILING

(71) Applicant: Applied Materials, Inc., Santa Clara, CA (US)

(72) Inventors: Kenneth S. Collins, San Jose, CA (US); Michael R. Rice, Pleasanton, CA (US); Kartik Ramaswamy, San Jose, CA (US); James D. Carducci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 779 days.

(21) Appl. No.: 15/630,833

(22) Filed: Jun. 22, 2017

(65) Prior Publication Data

US 2018/0308666 A1 Oct. 25, 2018

Related U.S. Application Data

(60) Provisional application No. 62/489,344, filed on Apr. 24, 2017.

(51) Int. Cl.
*H01L 21/00* (2006.01)
*C23C 16/00* (2006.01)
(Continued)

(52) U.S. Cl.
CPC ...... *H01J 37/321* (2013.01); *C23C 16/45536* (2013.01); *C23C 16/45544* (2013.01);
(Continued)

(58) Field of Classification Search
CPC .......... H01J 37/32357; H01J 37/32825; H01L 21/02054
(Continued)

(56) References Cited

U.S. PATENT DOCUMENTS

| 4,765,179 A | 8/1988 | Fuller et al. |
| 4,825,467 A | 4/1989 | Rist et al. |

(Continued)

FOREIGN PATENT DOCUMENTS

| CN | 1261927 | 8/2000 |
| CN | 102264943 | 11/2011 |

(Continued)

OTHER PUBLICATIONS

Anders, "Plasma and Ion Sources in Large Area Coatings: A Review," The International Conference on Metallurgical Coatings and Thin Films (ICMCTF), Feb. 2005, 42 pages.

(Continued)

*Primary Examiner* — Sylvia Macarthur
*Assistant Examiner* — Michelle Crowell
(74) *Attorney, Agent, or Firm* — Fish & Richardson P.C.

(57) ABSTRACT

A plasma reactor includes a chamber body having an interior space that provides a plasma chamber and having a ceiling, a gas distributor to deliver a processing gas to the plasma chamber, a pump coupled to the plasma chamber to evacuate the chamber, a workpiece support to hold a workpiece, and an intra-chamber electrode assembly. The intra-chamber electrode assembly includes an insulating frame, a first plurality of coplanar filaments that extend laterally through the plasma chamber between the ceiling and the workpiece support along a first direction, and a second plurality of coplanar filaments that extend in parallel through the plasma chamber along a second direction perpendicular to the first direction. Each filament of the first and second plurality of filaments includes a conductor at least partially surrounded by an insulating shell. A first RF power source supplies a first RF power to the conductor of the intra-chamber electrode assembly.

17 Claims, 6 Drawing Sheets

(51) Int. Cl.
| | | |
|---|---|---|
| *H01J 37/32* | (2006.01) | |
| *C23C 16/507* | (2006.01) | |
| *C23C 16/54* | (2006.01) | |
| *C23C 16/509* | (2006.01) | |
| *C23C 16/455* | (2006.01) | |
| *H01L 21/67* | (2006.01) | |
| *H01L 21/683* | (2006.01) | |
| *H01L 21/687* | (2006.01) | |

(52) U.S. Cl.
CPC .......... *C23C 16/507* (2013.01); *C23C 16/509* (2013.01); *C23C 16/545* (2013.01); *H01J 37/3277* (2013.01); *H01J 37/32449* (2013.01); *H01J 37/32568* (2013.01); *H01J 37/32715* (2013.01); *H01J 37/32816* (2013.01); *H01L 21/67069* (2013.01); *H01L 21/6831* (2013.01); *H01L 21/68785* (2013.01); *H01J 2237/334* (2013.01); *H01J 2237/3321* (2013.01)

(58) Field of Classification Search
USPC ........................ 118/723 ER, 723 R
See application file for complete search history.

(56) References Cited

U.S. PATENT DOCUMENTS

| | | | |
|---|---|---|---|
| 4,903,297 | A | 2/1990 | Rist et al. |
| 5,522,934 | A | 6/1996 | Suzuki et al. |
| 6,082,294 | A * | 7/2000 | Simpson ................ C23C 16/272 |
| | | | 118/723 E |
| 6,161,499 | A * | 12/2000 | Sun ......................... C23C 16/02 |
| | | | 118/723 E |
| 6,164,241 | A | 12/2000 | Chen et al. |
| 6,221,155 | B1 * | 4/2001 | Keck ....................... C23C 16/24 |
| | | | 117/200 |
| 6,313,430 | B1 | 11/2001 | Fujioka et al. |
| 6,353,201 | B1 | 3/2002 | Yamakoshi et al. |
| 6,444,085 | B1 | 9/2002 | Collins et al. |
| 6,456,010 | B2 | 9/2002 | Yamakoshi et al. |
| 6,503,816 | B2 | 1/2003 | Ito et al. |
| 7,001,831 | B2 | 2/2006 | Niira et al. |
| 7,205,034 | B2 | 4/2007 | Kawamura et al. |
| 7,833,587 | B2 | 11/2010 | Mashima et al. |
| 7,868,517 | B2 | 1/2011 | Belot et al. |
| 7,871,940 | B2 * | 1/2011 | Schropp .................. C23C 16/44 |
| | | | 118/715 |
| 8,081,049 | B2 | 12/2011 | Yoshida |
| 8,129,912 | B2 | 3/2012 | Ko et al. |
| 8,607,733 | B2 * | 12/2013 | Tachibana ............ C23C 16/452 |
| | | | 118/723 IR |
| 8,914,166 | B2 | 12/2014 | He |
| 9,165,748 | B2 | 10/2015 | Takagi et al. |
| 9,194,036 | B2 * | 11/2015 | Kim ................... C23C 14/3407 |
| 9,355,821 | B2 | 5/2016 | Chen et al. |
| 9,396,900 | B2 | 6/2016 | Lane et al. |
| 9,419,583 | B2 | 8/2016 | Rinaldi et al. |
| 9,431,217 | B2 | 8/2016 | Mai et al. |
| 9,554,738 | B1 | 1/2017 | Gulati et al. |
| 9,673,025 | B2 | 6/2017 | Benjamin et al. |
| 9,673,042 | B2 * | 6/2017 | Visser ............... H01L 21/76831 |
| 10,269,593 | B2 * | 4/2019 | Griffith Cruz .... H01L 21/67017 |
| 10,510,515 | B2 * | 12/2019 | Collins ................. C23C 16/4584 |
| 2001/0021422 | A1 | 9/2001 | Yamakoshi et al. |
| 2003/0233981 | A1 * | 12/2003 | Sasaguri ........... H01J 37/32009 |
| | | | 118/723 E |
| 2004/0004062 | A1 | 1/2004 | Kumar et al. |
| 2004/0011466 | A1 | 1/2004 | Matsumoto et al. |
| 2004/0020432 | A1 * | 2/2004 | Takagi ............... H01J 37/32146 |
| | | | 118/723 I |
| 2004/0060657 | A1 * | 4/2004 | Saigusa ............. H01J 37/32477 |
| | | | 156/345.1 |
| 2004/0060662 | A1 | 4/2004 | Yeom et al. |
| 2005/0067934 | A1 | 3/2005 | Ueda et al. |
| 2006/0021703 | A1 | 2/2006 | Umotoy et al. |
| 2006/0138957 | A1 * | 6/2006 | Fujioka ................. B32B 18/00 |
| | | | 313/586 |
| 2006/0185595 | A1 * | 8/2006 | Coll ...................... C23C 16/44 |
| | | | 118/724 |
| 2007/0012250 | A1 * | 1/2007 | Yeom .................... H01J 37/321 |
| | | | 118/723 AN |
| 2007/0048200 | A1 | 3/2007 | Takao et al. |
| 2007/0068455 | A1 | 3/2007 | Bolden |
| 2010/0239757 | A1 | 9/2010 | Murata |
| 2011/0008550 | A1 | 1/2011 | Murata et al. |
| 2011/0033639 | A1 * | 2/2011 | Coll ...................... C23C 16/50 |
| | | | 427/585 |
| 2011/0104884 | A1 * | 5/2011 | Koshiishi .......... H01J 37/32623 |
| | | | 438/597 |
| 2011/0203101 | A1 * | 8/2011 | Gum ..................... C01B 33/035 |
| | | | 29/458 |
| 2012/0229012 | A1 * | 9/2012 | Inouchi .................. H01J 27/14 |
| | | | 313/363.1 |
| 2012/0247390 | A1 | 10/2012 | Sawada et al. |
| 2013/0105083 | A1 | 5/2013 | Shih et al. |
| 2013/0105086 | A1 | 5/2013 | Banna et al. |
| 2013/0292057 | A1 | 11/2013 | Ramaswamy et al. |
| 2013/0344247 | A1 * | 12/2013 | Ueyama ................. C23C 16/24 |
| | | | 427/255.28 |
| 2016/0005631 | A1 * | 1/2016 | Griffith Cruz .... H01L 21/67109 |
| | | | 118/715 |
| 2016/0217978 | A1 * | 7/2016 | Mai ..................... H01J 37/32669 |
| 2018/0308661 | A1 * | 10/2018 | Collins ............. C23C 16/45544 |
| 2018/0308663 | A1 * | 10/2018 | Collins ............. H01J 37/32091 |
| 2018/0308664 | A1 * | 10/2018 | Collins ................. H01J 37/321 |
| 2018/0308666 | A1 * | 10/2018 | Collins ............. C23C 16/45544 |
| 2018/0308667 | A1 * | 10/2018 | Collins ............. C23C 16/45544 |
| 2018/0374684 | A1 * | 12/2018 | Collins ................ C23C 16/4584 |
| 2018/0374685 | A1 * | 12/2018 | Collins ............. H01J 37/32091 |

FOREIGN PATENT DOCUMENTS

| | | | | |
|---|---|---|---|---|
| CN | 102548177 | | 7/2012 | |
| CN | 205177785 | | 4/2016 | |
| JP | 06-061153 | | 3/1994 | |
| JP | 2001-257098 | | 9/2001 | |
| JP | 2001-274099 | | 10/2001 | |
| JP | 2001-274101 | | 10/2001 | |
| JP | 2002-305151 | | 10/2002 | |
| JP | 2002305151 | A * | 10/2002 | |
| JP | 2007-067157 | | 3/2007 | |
| JP | 2007067157 | A * | 3/2007 | ............. C30B 35/00 |
| JP | 2013-097958 | | 5/2013 | |
| JP | 2014-049541 | | 3/2014 | |

OTHER PUBLICATIONS

Chang et al., "Generating large-area uniform microwave field for plasma excitation," Physics of Plasmas, 2012, 19, 6 pages.
Chen et al., "Generation of uniform large-area very high frequency plasmas by launching two specific standing waves simultaneously," Journal of Applied Physics, 2014, 116, 9 pages.
Chen et al., "Generation of Uniform Large-Area VHF Plasmas by Launching a Traveling Wave," Plasma Processes and Polymers, Jan. 2014, 11(1): 7-11.
Cober Electronics, Inc., "Plasmaline Large Area Plasma Systems," Stan Whitehair, 21 pages.
Goya et al., "Development of Amorphous Silicon/Microcrystalline Silicon Tandem Solar Cells," 3rd World Conference on Photovoltaic Energy Conversion, Osaka, Japan, May 11-18, 2003, 1570-1573.
He and Hall, "Longitudinal voltage distribution in transverse rf discharge waveguide lasers," J. Appl. Phys., Aug. 1983, 54(8): 4367-4373.
Hollenstein et al., "Resonant RF network antennas for large-area and large-volume inductively coupled plasma sources," Plasma Sources Sci. Technol,, 2013, 22: 1-10.
Hwang et al., "Dual comb-type electrodes as a plasma source for very high frequency plasma enhanced chemical vapor deposition," Thin Solid Films, 2010, 518: 2124-2127.

(56) References Cited

OTHER PUBLICATIONS

Ito et al., "Large Area Deposition of Hydrogenated Amorphous Silicon by VHF-PECVD Using Novel Electrodes," IEEE, 900-903.
Livesay, "Large-area electron-beam source," J. Vac. Sci. Technol., Nov. 1993, 11(6): 2304-2308.
Mashima et al., "Characteristics of Very High Frequency Plasma Produced Using a Ladder-Shaped Electrode," Jpn. J. Appl. Phys., 1999, 38: 4305-4308.
Mashima et al., "Large area VHF plasma production using a ladder-shaped electrode," Thin Solid Films, 2006, 512-516.
Meiling et al., "Film Uniformity and Substrate-To-Electrode Attachment in Large-Area VHF Glow-Discharge Deposition of a-Si:H," $25^{th}$ PVSC, May 1996, 1153-1156.
Morrison et al., "Deposition of Microcrystalline Silicon Films and Solar Cells via the Pulsed PECVD Technique," IEEE, 1102-1105.
Noda et al., "Large Area Thin Film Si Tandem Module Production Using VHF Plasma with a Ladder-Shaped Electrode," $3^{rd}$ World Conference on Photovoltaic Energy Conversion, May 11-18, 2003, Osaka, Japan, 1849-1851.
Satake et al., "Experimental and numerical studies on voltage distribution in capacitively coupled very high-frequency plasmas," Plasma Sources Sci. Technol., 2004, 13: 436-445.
Sato et al., "Design of Folded Monopole Array Antenna Used for Large Area Plasma Production," IEEE, 2004, 1026-1029.
Schmidt et al., "Improving plasma uniformity using lens-shaped electrodes in a large area very high frequency reactor," Journal of Applied Physics, May 2004, 95(9): 4559-4564.
Schmidt, "Characterization of a High-Density, Large-Area VHF Plasma Source," Characterization of a High-Density, Large-Area VHF Plasma Source, 2006, 154 pages.
Stephan and Kuske, "Large Area Deposition Technique for PECVD of Amorphous Silicon," IEEE, 1997, 647-650.
Takagi et al., "Large Area Multi-Zone Type VHF-PCVD System for a-Si and μc-Si Deposition," $3^{rd}$ World Conference on Photovoltaic Energy Conversion, May 11-18, 2003, Osaka, Japan, 1792-1795.
Terasa et al., "PECVD of Doped and Intrinsic A-SI:H Layers for Solar Cell Structures Using A (Novel) Inline Deposition System," IEEE, 1528-1531.
Wu et al., "A traveling wave-driven, inductively coupled large area plasma source," Applied Physics Letters, Feb. 1998, 72(7): 777-779.
Wu et al., "The influence of antenna configuration and standing wave effects on density profile in a large-area inductive plasma source," Plasma Sources Sci. Technol., 2000, 9: 210-218.
Yamauchi et al., "Development of a-Si/Micro-crystalline-Si Tandem-type Photovoltaic Solar Cell," Technical Review, Oct. 2005, 42(3): 1-5.
Yamauchi et al., "High Efficiency Large Area Solar Module in Mitsubishi Heavy Industries," Technical Review, Oct. 2004, 41(5): 1-4.
Yu et al., "Linear Plasma Sources for Large Area Film Deposition: A Brief Review," Plasma Science and Technology, Apr. 2014, 16(4): 356-362.
Muegge, Microwave Plasma Processing, 2013, 12 pages, available from https://www.muegge.de/fileadmin/user_upload/muegge.de/PDF_Datasheets/Microwave-Plasma-Processing/Microwave-Plasma-Processing-Rev00.pdf.
International Search Report and Written Opinion in International Application No. PCT/US2018/028930, dated Aug. 9, 2018, 13 pages.

* cited by examiner

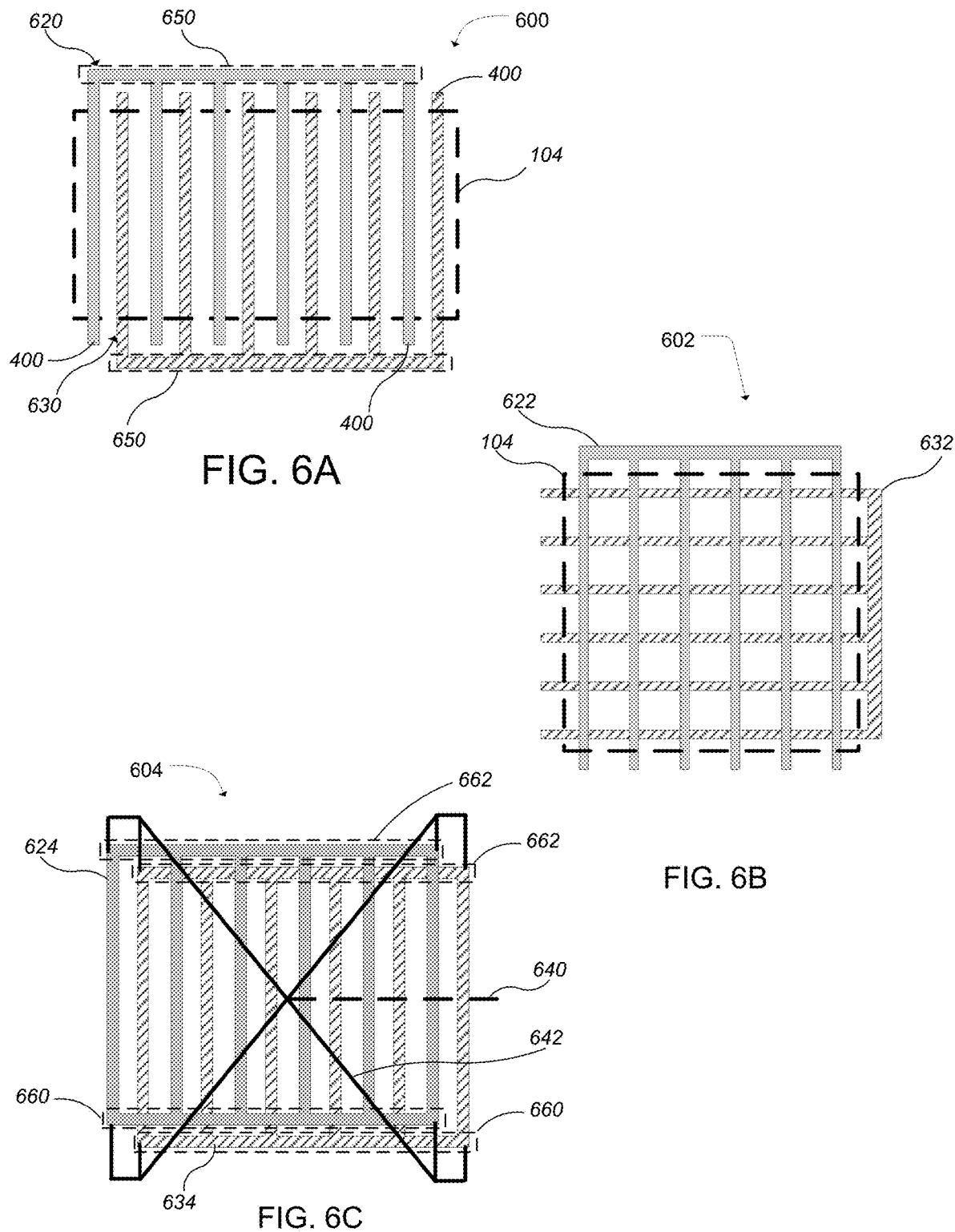

PLASMA REACTOR WITH ELECTRODE FILAMENTS EXTENDING FROM CEILING

CROSS-REFERENCE TO RELATED APPLICATIONS

The present application claims priority to U.S. Provisional Patent Application Ser. No. 62/489,344, filed Apr. 24, 2017, the entirety of which is incorporated by reference.

TECHNICAL FIELD

The present disclosure relates to a plasma reactor, e.g. for depositing a film on, etching, or treating a workpiece such as a semiconductor wafer.

BACKGROUND

Plasma is typically generated using a capacitively-coupled plasma (CCP) source or an inductively-coupled plasma (ICP) source. A basic CCP source contains two metal electrodes separated by a small distance in a gaseous environment similar to a parallel plate capacitor. One of the two metal electrodes are driven by a radio frequency (RF) power supply at a fixed frequency while the other electrode is connected to an RF ground, generating an RF electric field between the two electrodes. The generated electric field ionizes the gas atoms, releasing electrons. The electrons in the gas are accelerated by the RF electric field and ionizes the gas directly or indirectly by collisions, producing plasma.

A basic ICP source typically contains a conductor in a spiral or a coil shape. When an RF electric current is flowed through the conductor, RF magnetic field is formed around the conductor. The RF magnetic field accompanies an RF electric field, which ionizes the gas atoms and produces plasma.

Plasmas of various process gasses are widely used in fabrication of integrated circuits. Plasmas can be used, for example, in thin film deposition, etching, and surface treatment.

Atomic layer deposition (ALD) is a thin film deposition technique based on the sequential use of a gas phase chemical process. Some ALD processes use plasmas to provide necessary activation energy for chemical reactions. Plasma-enhanced ALD processes can be performed at a lower temperature than non-plasma-enhanced (e.g., 'thermal') ALD processes.

SUMMARY

In one aspect, a plasma reactor includes a chamber body having an interior space that provides a plasma chamber and having a ceiling, a gas distributor to deliver a processing gas to the plasma chamber, a pump coupled to the plasma chamber to evacuate the chamber, a workpiece support to hold a workpiece facing the ceiling, an intra-chamber electrode assembly that includes an insulating frame and a filament extending laterally through the plasma chamber between the ceiling and the workpiece support, the filament including a conductor at least partially surrounded by an insulating shell that extends from the insulating frame, and a first RF power source to supply a first RF power to the conductor of the intra-chamber electrode assembly.

Implementations may include one or more of the following features.

The insulating shell may be a cylindrical shell that surrounds and extends along an entirety of the conductor within the plasma chamber. The insulating shell may be formed from silicon, or an oxide, nitride or carbide material, or a combination thereof. The insulating shell may be formed from silica, sapphire or silicon carbide. The insulating shell may be a coating on the conductor. The cylindrical shell may form a channel and the conductor may be suspended in and extends through the channel, or the conductor may have a hollow channel. A fluid supply may be configured to circulate a fluid through the channel. The fluid may be a non-oxidizing gas. A heat exchanger may be configured to remove heat from or supply heat to the fluid.

The intra-chamber electrode assembly may have a plurality of coplanar filaments extending laterally through the plasma chamber between the ceiling and the workpiece support. The plurality of coplanar filaments may be uniformly spaced apart. A surface-to-surface spacing between the coplanar filaments and the workpiece support surface may be in the range of 2 mm to 25 mm. The plurality of coplanar filaments may include linear filaments. The plurality of coplanar filaments may extend in parallel through the plasma chamber. The plurality of coplanar filaments may be uniformly spaced apart.

The shell may be fused to the insulating frame. The shell and the insulating frame may be a same material composition. The insulating frame may be formed from silica, or a ceramic material.

In another aspect, a plasma reactor includes a chamber body having an interior space that provides a plasma chamber and having a ceiling and an insulating support to hold a top electrode, a gas distributor to deliver a processing gas to the plasma chamber, a pump coupled to the plasma chamber to evacuate the chamber, a workpiece support to hold a workpiece facing the top electrode, an intra-chamber electrode assembly comprising a filament extending laterally through the plasma chamber between the top electrode and the workpiece support, the filament including a conductor at least partially surrounded by an insulating shell that extends from the insulating frame, and a first RF power source to supply a first RF power to the conductor of the intra-chamber electrode assembly.

Implementations may include one or more of the following features.

The top electrode may be formed from silicon, carbon, or a combination thereof. The insulating frame may be an oxide, nitride, or a combination thereof. The insulating frame may be formed from silicon oxide, aluminum oxide, or silicon nitride.

In another aspect, a plasma reactor includes a chamber body having an interior space that provides a plasma chamber and has a ceiling, a gas distributor to deliver a processing gas to the plasma chamber, a pump coupled to the plasma chamber to evacuate the chamber, a workpiece support to hold a workpiece, an intra-chamber electrode assembly that includes an insulating frame and a filament, the filament including a first portion extending downwardly from the ceiling and a second portion extending laterally through the plasma chamber between the ceiling and the workpiece support, the filament including a conductor at least partially surrounded by an insulating shell, and, a first RF power source to supply a first RF power to the conductor of the intra-chamber electrode assembly.

Implementations may include one or more of the following features.

The intra-chamber electrode assembly may include a plurality of filaments. Each filament may include a first portion extending downwardly from the ceiling and a second portion extending laterally through the plasma chamber between the ceiling and the workpiece support. The second portions of the plurality of filaments may be coplanar. The second portions of the plurality of filaments may be uniformly spaced apart. The second portions of the plurality of filaments may be linear.

The support may include a downwardly projecting side wall that surrounds a volume between the ceiling and the second portion of the filament. The side wall may be formed from silicon oxide or a ceramic material. The ceiling may include an insulating frame, and the filaments may extend out of the insulating frame. The shell may be fused to the frame. The shell and the support may have a same material composition. The insulating frame may be formed from silica, or a ceramic material.

In another aspect, a plasma reactor includes a chamber body having an interior space that provides a plasma chamber and having a ceiling, a gas distributor to deliver a processing gas to the plasma chamber, a pump coupled to the plasma chamber to evacuate the chamber, a workpiece support to hold a workpiece, and an intra-chamber electrode assembly. The intra-chamber electrode assembly includes an insulating frame, a first plurality of coplanar filaments that extend laterally through the plasma chamber between the ceiling and the workpiece support along a first direction, and a second plurality of coplanar filaments that extend in parallel through the plasma chamber along a second direction perpendicular to the first direction. Each filament of the first and second plurality of filaments includes a conductor at least partially surrounded by an insulating shell. A first RF power source supplies a first RF power to the conductor of the intra-chamber electrode assembly.

Certain implementations may have one or more of the following advantages. Plasma uniformity may be improved. Plasma process repeatability may be improved. Metal contamination may be reduced. Particle generation may be reduced. Plasma charging damage may be reduced. Uniformity of plasma may be maintained over different process operating conditions. Plasma power coupling efficiency may be improved.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 6A-C are schematic top view diagrams of various examples of intra-chamber electrode assembly configurations.

Like reference symbols in the various drawings indicate like elements.

DETAILED DESCRIPTION

Plasma uniformity in a conventional CCP source is typically determined by electrode(s) size and inter-electrode distance, as well as by gas pressure, gas composition, and applied RF power. At higher radio frequencies, additional effects may become significant or even dominate non-uniformities due to the presence of standing waves or skin effects. Such additional effects becomes more pronounced at higher frequencies and plasma densities.

Plasma uniformity in a conventional ICP source is typically determined by the configuration of ICP coil(s) including its size, geometry, distance to workpiece, and associated RF window location, as well as by gas pressure, gas composition, and power. In case of multiple coils or coil segments, the current or power distribution and their relative phase, if driven at same frequency, might also be a significant factor. Power deposition tends to occur within several centimeters under or adjacent to ICP coils due to skin effect, and such localized power deposition typically leads to process non-uniformities that reflect the coil geometries. Such plasma non-uniformity causes a potential difference across a workpiece, which can also lead to plasma charging damage (e.g., transistor gate dielectric rupture).

A large diffusion distance is typically needed for improved uniformity of ICP source. However, a conventional ICP source with a thick RF window is typically inefficient at high gas pressures due to low power coupling, which leads to high drive current resulting in high resistive power losses. In contrast, an intra-chamber electrode assembly does not need to have an RF window, but only a cylindrical shell. This can provide better power coupling and better efficiency.

In a plasma chamber with a moving workpiece support, the moving workpiece support may be DC grounded through, for example, a rotary mercury coupler, brushes, or slip rings. However, the moving workpiece support may not be adequately grounded at radio frequencies. The RF ground path should have substantially lower impedance than the plasma for it to be an adequate RF ground. The lack of an adequate RF ground path may make it difficult to control ion energy at the workpiece and reduce the repeatability of the process.

A plasma source with the following properties is thus desired: it can efficiently produce a uniform plasma with the desired properties (plasma density, electron temperature, ion energy, dissociation, etc.) over the workpiece size; it is tunable for uniformity over the operating window (e.g. pressure, power, gas composition); it has stable and repeatable electrical performance even with a moving workpiece; and it does not generate excessive metal contaminants or particles. An intra-chamber electrode assembly might be better able to provide one or more of these properties.

Figure 1:
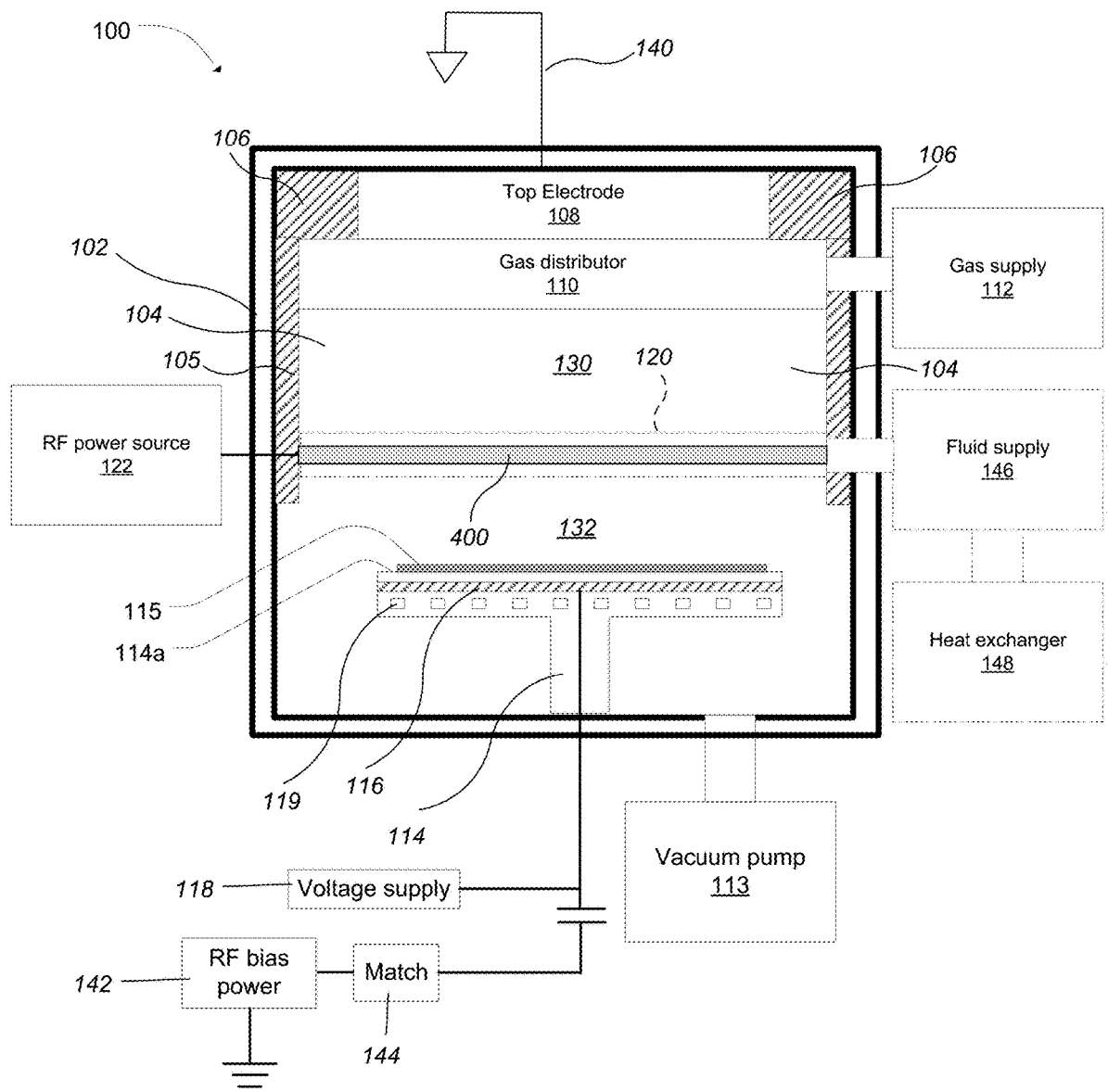
FIG. 1 is a schematic side view diagram of an example of a plasma reactor.

FIG. 1 is a schematic side view diagram of an example of a plasma reactor. A plasma reactor 100 has a chamber body 102 enclosing an interior space 104 for use as a plasma chamber. The interior space 104 can be cylindrical, e.g., for processing of circular semiconductor wafers. The chamber body 102 has a support 106 located near the ceiling of the plasma reactor 100, which supports a top electrode 108. The top electrode can be suspended within the interior space 104 and spaced from the ceiling, abut the ceiling, or form a portion of the ceiling. Some portions of the side walls of the chamber body 102 can be grounded independent of the top electrode 108.

A gas distributor 110 is located near the ceiling of the plasma reactor 100. In some implementations, the gas distributor 110 is integrated with the top electrode 108 as a single component. The gas distributor 110 is connected to a gas supply 112. The gas supply 112 delivers one or more process gases to the gas distributor 110, the composition of which can depend on the process to be performed, e.g., deposition or etching. A vacuum pump 113 is coupled to the interior space 104 to evacuate the plasma reactor. For some processes, the chamber is operated in the Torr range, and the gas distributor 110 supplies argon, nitrogen, oxygen and/or other gases.

A workpiece support pedestal 114 for supporting a workpiece 115 is positioned in the plasma reactor 100. The workpiece support pedestal 114 has a workpiece support surface 114a facing the top electrode 108.

In some implementations, the workpiece support pedestal 114 includes a workpiece support electrode 116 inside the workpiece support pedestal 114. In some implementations, the workpiece support electrode 116 may be grounded or connected to an impedance or circuit which is grounded. In some implementations, an RF bias power generator 142 is coupled through an impedance match 144 to the workpiece support electrode 116. The workpiece support electrode 116 may additionally include an electrostatic chuck, and a workpiece bias voltage supply 118 may be connected to the workpiece support electrode 116. The RF bias power generator 142 may be used to generate plasma, control electrode voltage or electrode sheath voltage, or to control ion energy of the plasma.

Additionally, the pedestal 114 can have internal passages 119 for heating or cooling the workpiece 115. In some implementations, an embedded resistive heater can be provided inside the pedestal, e.g., inside the internal passages 119.

In some implementations, the workpiece support pedestal 114 is heated through radiant and/or convective heating from a heating element located within a bottom interior space 132, and/or by a resistive heater on or embedded in the pedestal 114.

An intra-chamber electrode assembly 120 is positioned in the interior space 104 between the top electrode 108 and the workpiece support pedestal 114. This electrode assembly 120 includes one or more filaments 400 that extend laterally in the chamber over the support surface 114a of the pedestal 114. At least a portion of the filaments of the electrode assembly 120 over the pedestal 114 extends parallel to the support surface 114a. A top gap 130 is formed between the top electrode 108 and the intra-chamber electrode assembly 120. A bottom gap 132 is formed between the workpiece support pedestal 114 and the intra-chamber electrode assembly 120.

The electrode assembly 120 is driven by an RF power source 122. The RF power source 122 can apply power to the one or more filaments of the electrode assembly 120 at frequencies of 1 MHz to over 300 MHz. For some processes, the RF power source 122 provides a total RF power 100 W to more than 2 kW at a frequency of 60 MHz.

In some implementations, it may be desirable to select the bottom gap 132 to cause plasma generated radicals, ions or electrons to interact with the workpiece surface. The selection of gap is application-dependent and operating regime dependent. For some applications wherein it is desired to deliver a radical flux (but very low ion/electron flux) to the workpiece surface, operation at larger gap and/or higher pressure may be selected. For other applications wherein it is desired to deliver a radical flux and substantial plasma ion/electron flux to the workpiece surface, operation at smaller gap and/or lower pressure may be selected. For example, in some low-temperature plasma-enhanced ALD processes, free radicals of process gases are necessary for the deposition or treatment of an ALD film. A free radical is an atom or a molecule that has an unpaired valence electron. A free radical is typically highly chemically reactive towards other substances. The reaction of free radicals with other chemical species often plays an important role in film deposition. However, free radicals are typically short-lived due to their high chemical reactivity, and therefore cannot be transported very far within their lifetime. Placing the source of free radicals, namely the intra-chamber electrode assembly 120 acting as a plasma source, close to the surface of the workpiece 115 can increase the supply of free radicals to the surface, improving the deposition process.

The lifetime of a free radical typically depends on the pressure of the surrounding environment. Therefore, a height of the bottom gap 132 that provides satisfactory free radical concentration can change depending on the expected chamber pressure during operation. In some implementations, if the chamber is to be operated at a pressure in the range of 1-10 Torr, the bottom gap 132 is less than 1 cm.

In other low(er) temperature plasma-enhanced ALD processes, exposure to plasma ion flux (and accompanying electron flux) as well as radical flux may be necessary for deposition and treatment of an ALD film. In some implementations, if the chamber is to be operated at a pressure in the range of 1-10 Torr, the bottom gap 132 is less than 5 cm—for example 2-25 mm, e.g., 5 mm. Lower operating pressures may operate at larger gaps due to lower volume recombination rate with respect to distance. In other applications, such as etching, lower operating pressure is typically used (less than 100 mTorr) and the gap may be increased.

In such applications where the bottom gap 132 is small, the plasma generated by the electrode assembly 120 can have significant non-uniformities between the filaments, which may be detrimental to processing uniformity of the workpiece. By moving the workpiece through the plasma having spatial non-uniformities, the effect of the plasma spatial non-uniformities on the process can be mitigated by a time-averaging effect, i.e., the cumulative plasma dose received by any given region of the workpiece after a single pass through the plasma is substantially similar.

The top gap may be selected large enough for plasma to develop between intra-chamber electrode assembly and top electrode (or top of chamber). In some implementations, if the chamber is to be operated at a pressure in the range of 1-10 Torr, the top gap 130 may be between 0.5-2 cm, e.g., 1.25 cm.

The top electrode 108 can be configured in various ways. In some implementations, the top electrode is connected to an RF ground 140. In some implementations, the top electrode is electrically isolated ('floating'). In some implementations, the top electrode 108 is biased to a bias voltage. The bias voltage can be used to control characteristics of the generated plasma, including the ion energy. In some implementations, the top electrode 108 is driven with an RF signal. For example, driving the top electrode 108 with respect to the workpiece support electrode 116 that has been grounded can increase the plasma potential at the workpiece 115. The increased plasma potential can cause an increase in ion energy to a desired value.

The top electrode 108 can be formed of different process-compatible materials. Various criteria for process-computability include a material's resistance to etching by the process gasses and resistance to sputtering from ion bombardment. Furthermore, in cases where a material does get etched, a process-compatible material preferably forms a volatile, or gaseous, compound which can be evacuated by the vacuum pump 113, and not form particles that can contaminate the workpiece 115. Accordingly, in some implementations, the top electrode is made of silicon. In some implementations, the top electrode is made of silicon carbide. In some implementations, the top electrode is made of carbon-based material.

In some implementations, the top electrode 108 may be omitted. In such implementations, RF ground paths may be provided by the workpiece support electrode or by a subset of coplanar filaments of the electrode assembly 120 or by a chamber wall or other ground-referenced surface in communication with plasma.

In some implementations, a fluid supply 146 circulates a fluid through the intra-chamber electrode assembly 120. In some implementations, a heat exchanger 148 is coupled to the fluid supply 146 to remove or supply heat to the fluid.

Depending on chamber configuration and supplied processing gasses, the plasma reactor 100 could provide an ALD apparatus, an etching apparatus, a plasma treatment apparatus, a plasma-enhanced chemical vapor deposition apparatus, a plasma doping apparatus, or a plasma surface cleaning apparatus.

Figure 2:
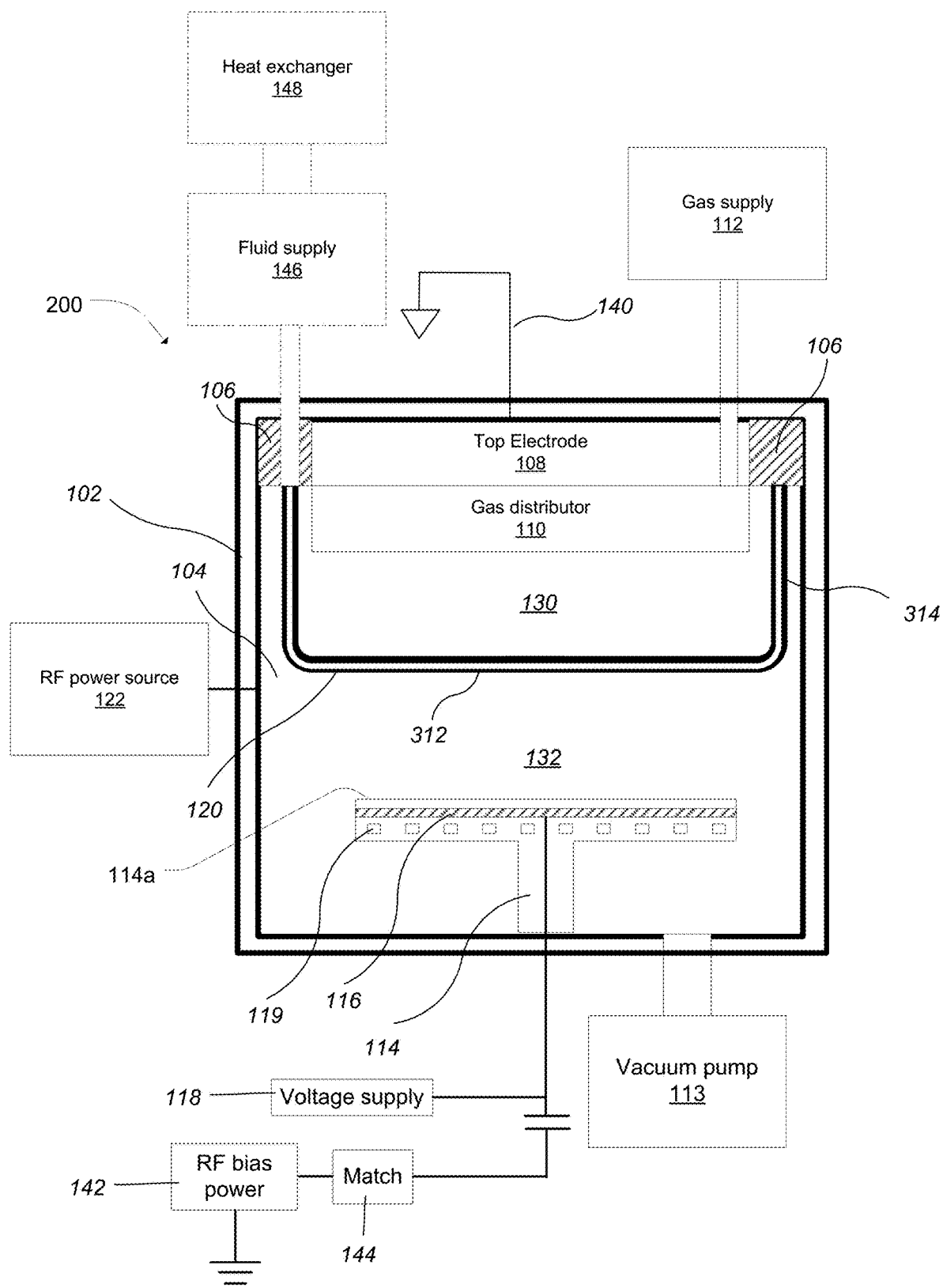
FIG. 2 is a schematic side view diagram of another example of a plasma reactor.

FIG. 2 is a schematic diagram of another example of a plasma reactor 200. In this example, which is the same as FIG. 1 except as described, the intra-chamber electrode assembly 120 is curved to be supported by the support 106, and the fluid supply 146 can be coupled to the intra-chamber electrode assembly 120 through the support 106. In contrast, in the example of FIG. 1, the filaments of the electrode assembly can emerge from and be supported by the side walls of the chamber body 102.

Figure 3:
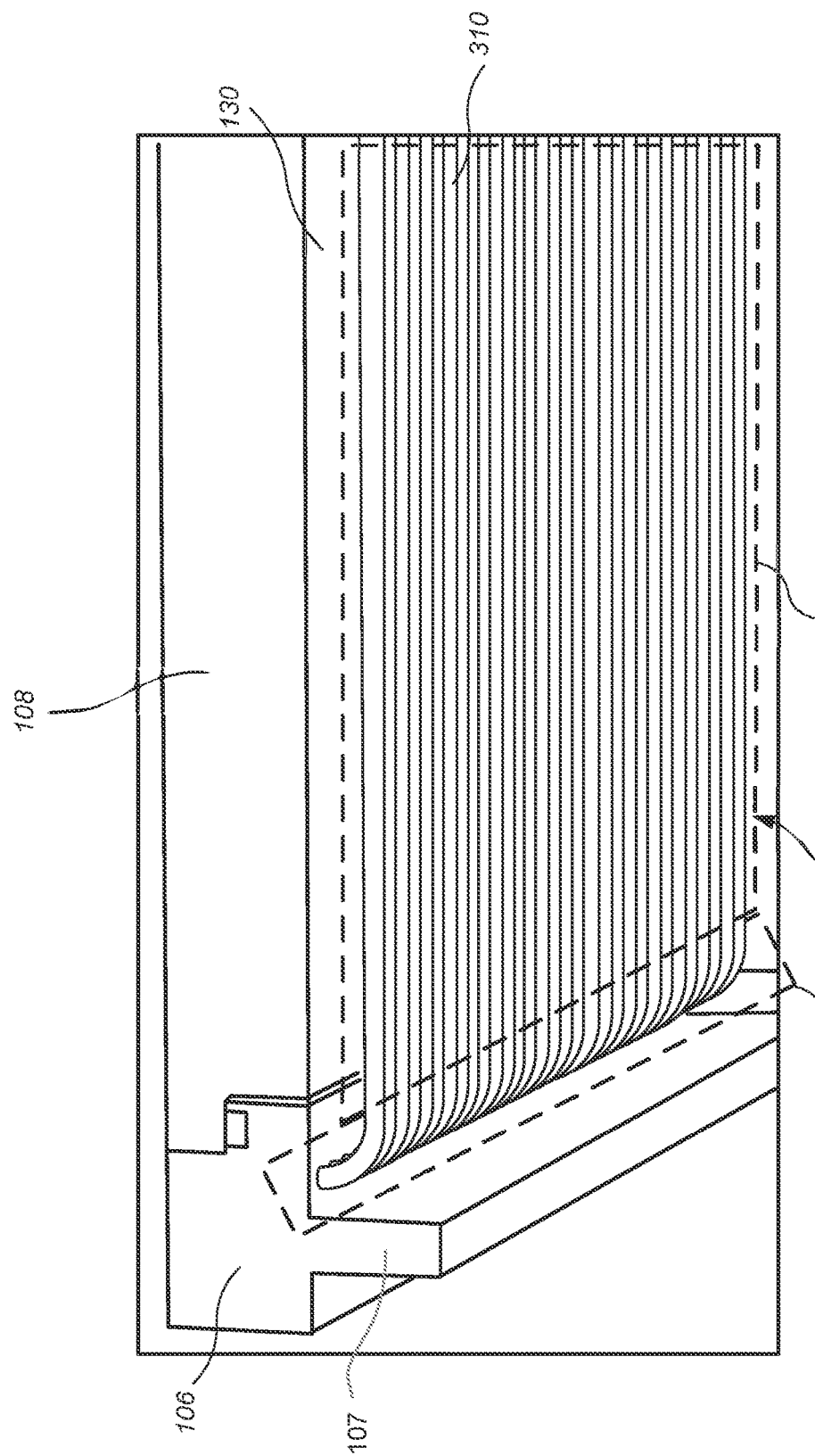
FIG. 3 is a perspective view of an example of an intra-chamber electrode assembly according to FIG. 2

FIG. 3 is a perspective view of an example of an intra-chamber electrode assembly according to FIG. 2. It shows the support 106, top electrode 108, the top gap 130, and the intra-chamber electrode assembly 120. The intra-chamber electrode assembly 120 includes one or more filaments 400 that extend laterally through the plasma chamber. The filaments include a central portion 312 that extends over the pedestal 114 (See FIG. 2) and end portions 314 that are curved upward to be supported from the support 106. This configuration can provide for a compact installation and accessibility of the filaments from the top of the plasma reactor 100.

Figure 4A:
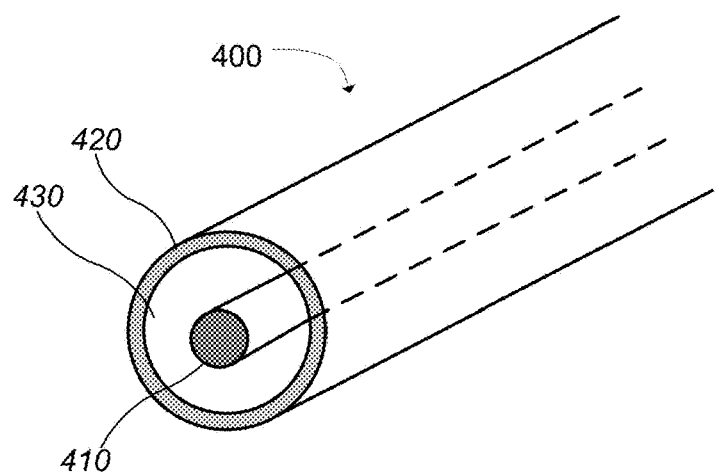
FIGS. 4A-4C are schematic cross-sectional perspective view diagrams of various examples of a filament of an intra-chamber electrode assembly.
Figure 4B:
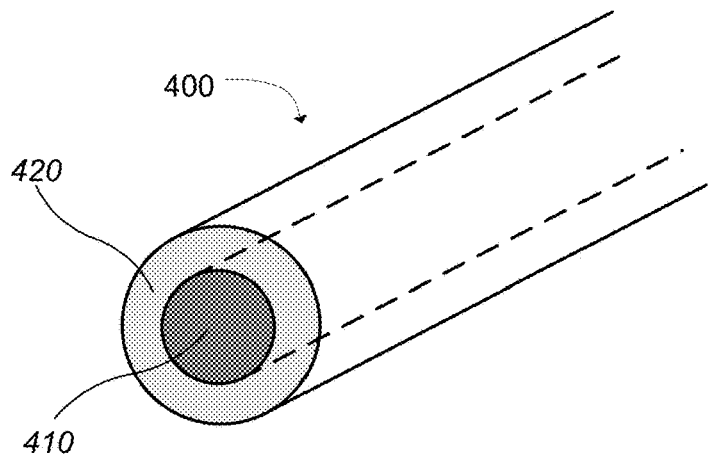
Figure 4C:
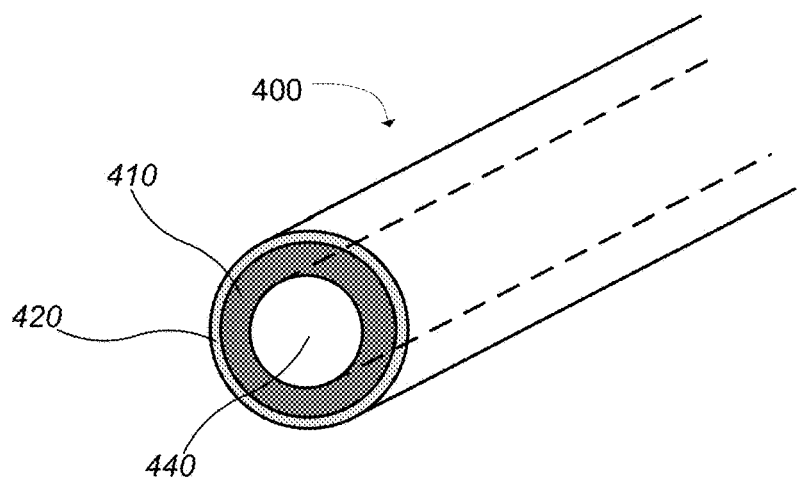

FIGS. 4A-C are schematic diagrams of various examples of a filament of an intra-chamber electrode assembly. Referring to FIG. 4A, a filament 400 of the intra-chamber electrode assembly 120 is shown. The filament 400 includes a conductor 410 and a cylindrical shell 420 that surrounds and extends along the conductor 410. A channel 430 is formed by the gap between the conductor 410 and the cylindrical shell 420. The cylindrical shell 420 is formed of a non-metallic material that is compatible with the process. In some implementations, the cylindrical shell is semiconductive. In some implementations, the cylindrical shell is insulative.

The conductor 410 can be formed of various materials. In some implementations, the conductor 410 is a solid wire, e.g., a single solid wire with a diameter of 0.063". Alternatively, the conductor 410 can be provided by multiple stranded wires. In some implementations, the conductor contains 3 parallel 0.032" stranded wires. Multiple stranded wires can reduce RF power losses through skin effect. Litz wire can further reduce the skin effect.

A material with high electrical conductivity, e.g., above $10^7$ Siemen/m, is used, which can reduce resistive power losses. In some implementations, the conductor 410 is made of copper or an alloy of copper. In some implementations, the conductor is made of aluminum.

Undesired material sputtering or etching can lead to process contamination or particle formation. Whether the intra chamber electrode assembly 120 is used as a CCP or an ICP source, undesired sputtering or etching can occur. The undesired sputtering or etching may be caused by excessive ion energy at the electrode surface. When operating as a CCP source, an oscillating electric field around the cylindrical shell is necessary to drive the plasma discharge. This oscillation leads to sputtering or etching of materials, as all known materials have a sputtering energy threshold that is lower than the corresponding minimum operating voltage of a CCP source. When operated as an ICP source, capacitive coupling of the filament 400 to the plasma creates an oscillating electric field at nearby surfaces, which also causes sputtering of materials. The problems resulting from undesired material sputtering or etching may be mitigated by using a process-compatible material for the outer surface of the filament 400 exposed to the interior space 104 (e.g., the cylindrical shell 420).

In some implementations, the cylindrical shell 420 is formed of a process-compatible material such as silicon, e.g., a high resistivity silicon, an oxide material, a nitride material, a carbide material, a ceramic material, or a combination thereof. Examples of oxide materials include silicon dioxide (e.g., silica, quartz) and aluminum oxide (e.g., sapphire). Examples of carbide materials include silicon carbide. Examples of nitride materials include silicon nitride. Ceramic materials or sapphire may be desirable for some chemical environments including fluorine-containing environments or fluorocarbon containing environments. In chemical environments containing ammonia, dichlorosilane, nitrogen, and oxygen, use of silicon, silicon carbide, or quartz may be desirable.

In some implementations, the cylindrical shell 420 has a thickness of 0.1 mm to 3 mm, e.g., 1 mm. The shell 420 can have an inner diameter of 2-4 mm, e.g., 2 mm.

In some implementations, a fluid is provided in the channel 430. In some implementations, the fluid is a non-oxidizing gas to purge oxygen to mitigate oxidization of the conductor 410. Examples of non-oxidizing gases are nitrogen and argon. In some implementations, the non-oxidizing gas is continuously flowed through the channel 430, e.g., by the fluid supply 146, to remove residual oxygen or water vapor.

The heating of conductor 410 can make the conductor more susceptible to oxidization. The fluid can provide cooling to the conductor 410, which may heat up from supplied RF power. In some implementations, the fluid is circulated through the channel 430, e.g., by the fluid supply 146, to provide forced convection temperature control, e.g., cooling or heating.

In some implementations, the fluid may be at or above atmospheric pressure to prevent breakdown of the fluid. This can prevent unwanted plasma formation in the tube. The pressure in the channel 430 can be at least 100 Torr.

Referring to FIG. 4B, in some implementations of the filament 400, the conductor 410 has a coating 420. In some implementations, the coating 420 is an oxide of the material forming the conductor (e.g., aluminum oxide on an aluminum conductor). In some implementations, the coating 420 is silicon dioxide. In some implementations, the coating 420 is formed in-situ in the plasma reactor 100 by, for example, a reaction of silane, hydrogen, and oxygen to form a silicon dioxide coating. In-situ coating may be beneficial as it can be replenished when etched or sputtered. The coating may be 0.1-10 microns thick.

Referring to FIG. 4C, in some implementations of the filament 400, the conductor 410 is hollow, and a hollow channel 440 is formed inside the conductor 410. In some implementations, the hollow channel 440 can carry a fluid as described in FIG. 4A. The conductor can be hollow tube with an outer diameter of about 1-4 mm, e.g., 2 mm, and a wall thickness of 0.25-1 mm, e.g., 0.5 mm. A coating of the process-compatible material can cover the conductor 410 to provide the cylindrical shell 420. In some implementations, the coating 420 is an oxide of the material forming the conductor (e.g., aluminum oxide on an aluminum conductor). In some implementations, the hollow conductor 410 has an outer diameter of 2 mm, with a wall thickness of 0.5 mm.

Returning to FIGS. 1 and 2, the filaments 400 are supported by and extend from a frame. The frame is formed of a process-compatible material such as an oxide material, a nitride material, a carbide material, a ceramic material, or a combination thereof. Examples of oxide materials include silicon dioxide (e.g., silica, quartz) and aluminum oxide (e.g., sapphire). Examples of carbide materials include silicon carbide. In some implementations, the frame and the shell of the filament 400 are formed of the same material, e.g., quartz.

The shell of the filament 400 can be fused to the frame. This can create a fluid-tight seal to prevent process gas from reaching the conductor, and thus can improve the lifetime of the reactor, and reduce the likelihood of contamination.

In some implementations, e.g., as shown in FIG. 1, the filaments 400 extend horizontally from the frame. In some implementations, e.g., as shown in FIG. 2, the frame provides a portion of the ceiling and the filaments 400 extend downwardly from the frame.

In some implementations, e.g., as shown in FIGS. 2 and 3, the frame can be provided by the support 106. In other implementations, the frame is a separate body, e.g., a body mounted to the ceiling or side walls 102. In some implementations, the frame is provided by the side walls of the chamber. The chamber walls can be conductive, but the insulating shell can isolate the conductor from the chamber wall.

As shown in FIG. 1, if the filaments 400 project horizontally from the frame, then the frame can be a body 105 that extends downwardly to surround the top gap 130. Alternatively, e.g., as shown in FIG. 3, if the filaments extend downwardly from the ceiling, the support 106 can include a downwardly projecting wall 107 that surrounds the top gap 130. The body 105 or wall 107 can be integrally formed or fused to the support 106 to provide a fluid-tight seal.

Figure 5A:
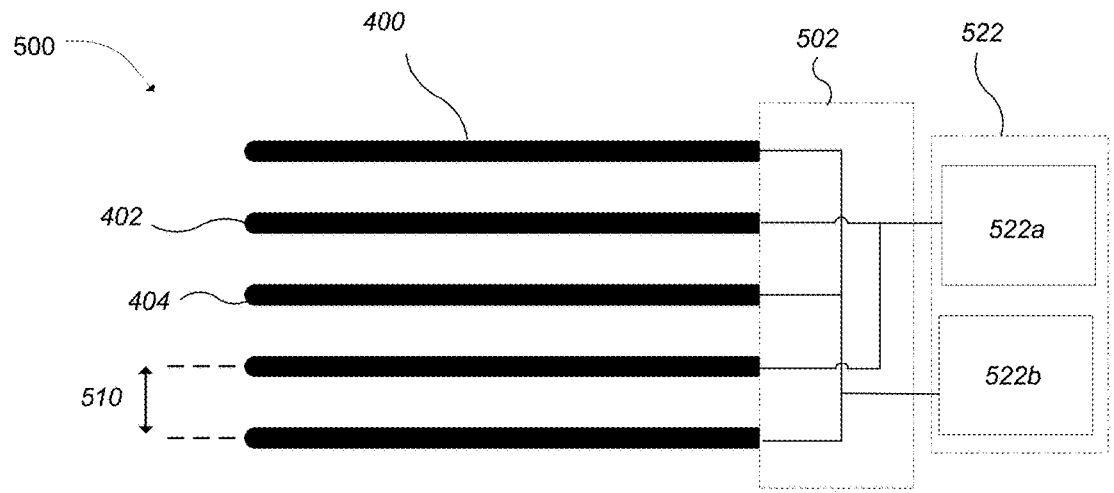
FIG. 5A is a schematic top view diagram of a portion of an intra-chamber electrode assembly.

FIG. 5A is a schematic diagram of a portion of an intra-chamber electrode assembly. An intra-chamber electrode assembly 500 includes multiple filaments 400 attached at a support 502. The electrode assembly 500 can provide the electrode assembly 120, and the filaments 400 can provide the filaments of the electrode assembly 120. In some implementations, the filaments extend in parallel to each other.

The filaments 400 are separated from one another by a filament spacing 510. The filament spacing 510 can be the surface-to-surface distance; for parallel filaments the spacing can be measured perpendicular to the longitudinal axis of the filaments. The spacing 510 can impact plasma uniformity. If the spacing is too large, then the filaments can create shadowing and non-uniformity. On the other hand, if the spacing is too small, the plasma cannot migrate between the top gap 130 and the bottom gap 132, and non-uniformity will be increased or ion density or free radical density will be reduced. In some implementations, the filament spacing 510 is uniform across the assembly 500.

The filament spacing 510 can be 3 to 20 mm, e.g., 8 mm. At high pressure, e.g., 2-10 torr in $N_2$, the filament spacing may be 20 mm to 3 mm. A compromise over the pressure range may be 5-10 mm. At lower pressure and greater distance to workpiece larger spacing may be effectively used.

Figure 5B:
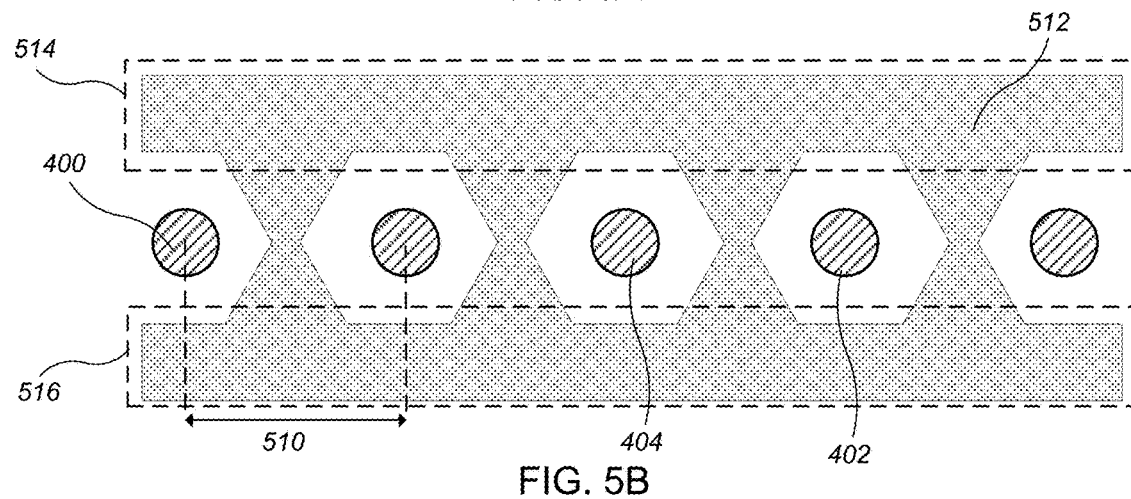
FIGS. 5B-C are cross-sectional schematic side view diagrams of an intra-chamber electrode assembly with different plasma region states.
Figure 5C:
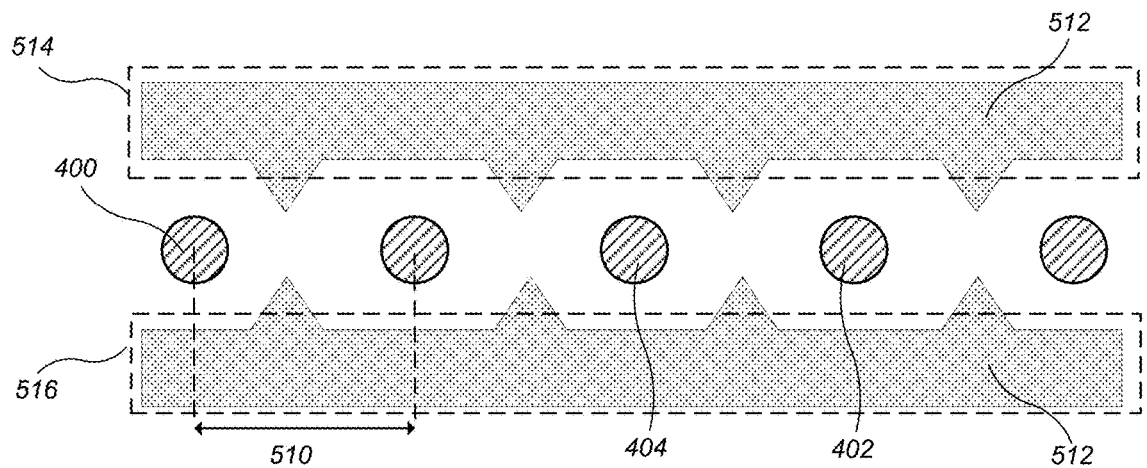

FIGS. 5B-C are cross-sectional schematic diagrams of an intra-chamber electrode assembly with different plasma region states. Referring to FIG. 5B, a plasma region 512 surrounds the filaments 400. The plasma region 512 has an upper plasma region 514 and a lower plasma region 516. The upper plasma region 514 is located at the top gap 130 and the lower plasma region 516 is located at the bottom gap 132. As shown in FIG. 5B, the upper plasma region 514 and the lower plasma region 516 is connected through the gaps between the filaments 400, forming a continuous plasma region 512. This continuity of the plasma regions 512 is desirable, as the regions 514 and 516 'communicate' with each other through exchange of plasma. Particularly for a monopolar drive (all the filaments connected to same power source) and a grounded top electrode as the main ground path, the exchanging of plasma helps keep the two regions electrically balanced, aiding plasma stability and repeatability.

In the case of a monopolar drive with the filaments driven with respect to some other ground and in the absence of a top ground (such as with a grounded workpiece) then plasma need not be generated above the filaments. Also in the case of differential drive (e.g. alternating filaments connect to each side of power supply output), then plasma can be generated between the filaments, so plasma above the filaments is not necessary. However, in these cases a grounded top electrode should not be detrimental.

Referring to FIG. 5C, in this state, the upper plasma region 514 and the lower plasma region 516 are not connected to each other. This 'pinching' of the plasma region 512 is not desirable for plasma stability. The shape of the plasma region 512 can be modified by various factors to remove the plasma region discontinuity or improve plasma uniformity.

In general, the regions 512, 514, and 516 can have a wide range of plasma densities, and are not necessarily uniform. Furthermore, the discontinuities between the upper plasma region 514 and the lower plasma region 516 shown in FIG. 5C represents a substantially low plasma density relative to the two regions, and not necessarily a complete lack of plasma in the gaps.

The top gap 130 is a factor affecting the shape of the plasma region. Depending on the pressure, when the top electrode 108 is grounded, reducing the top gap 130 typically leads to a reduction of plasma density in the upper plasma region 514. Specific values for the top gap 130 can be determined based on computer modelling of the plasma chamber. For example, the top gap 130 can be 3 mm to 8 mm, e.g., 4.5 mm.

The bottom gap 132 is a factor affecting the shape of the plasma region. Depending on the pressure, when the workpiece support electrode 116 is grounded, reducing the bottom gap 132 typically leads to a reduction of plasma density in the lower plasma region 516. Specific values for the bottom gap 132 can be determined based on computer modelling of the plasma chamber. For example, the bottom gap 132 can be 3 mm to 9 mm, e.g., 4.5 mm.

The phase of the RF signal driving adjacent filaments 400 is a factor affecting the shape of the plasma region. When the phase difference of the two RF signals driving the adjacent filaments is set to 0 degrees ('monopolar', or 'singled-ended'), the plasma region is pushed out from the gaps between the filaments 400, leading to discontinuity or non-uniformity. When the phase difference of the RF signals driving the adjacent filaments is set to 180 degrees ('differential'), the plasma region is more strongly confined between the filaments 400. Any phase difference between 0 and 360 degrees can be used to affect the shape of the plasma region 512.

The grounding of the workpiece support electrode 116 is a factor affecting the shape of the plasma region. Imperfect RF grounding of the electrode 116 in combination with 0 degrees of phase difference between the RF signals driving the adjacent filaments pushes the plasma region towards the top gap. However, if adjacent filaments, e.g., filaments 402 and 404 are driven with RF signals that have 180 degrees of phase difference, the resulting plasma distribution is much less sensitive to imperfect RF grounding of the electrode 116. Without being limited to any particular theory, this can be because the RF current is returned through the adjacent electrodes due to the differential nature of the driving signals. In some implementations, the intra-chamber electrode assembly 500 can include a first group and a second group of filaments 400. The first group and the second group can be spatially arranged such that the filaments alternate between the first group and the second group. For example, the first group can include the filament 402, the second group can include the filaments 400 and 404. The first group can be driven by a first terminal 522a of an RF power supply 522 and the second group can be driven by a second terminal 522b of the RF power supply 522. The RF power supply 522 can be configured to provide a first RF signal at the terminal 522a and a second RF signal at terminal 522b. The first and second RF signals can have a same frequency and a stable phase relationship to each other. For example, the phase relationship can include 0 degrees and 180 degrees. In some implementations, the phase relationship between the first and the second RF signals provided by the RF power supply 522 can be tunable between 0 and 360. In some implementations, the RF supply 522 can include two individual RF power supplies that are phase-locked to each other.

FIGS. 6A-C are schematic diagrams of various examples of intra-chamber electrode assembly configurations. Referring to FIG. 6A, an intra-chamber electrode assembly 600 includes a first interdigitated electrode subassembly 620 and a second interdigitated electrode subassembly 630. The subassembly 620 and 630 each has multiple parallel filaments 400 that are connected by a bus 650 at one end. In some implementations, the bus 650 connecting the filaments 400 is located outside of the interior space 104. In some implementations, the bus 650 connecting the filaments 400 is located in the interior space 104. The first interdigitated electrode subassembly 620 and a second interdigitated electrode subassembly 630 are oriented parallel to each other such that the filaments of the subassemblies 620 and 630 are parallel to each other.

Referring to FIG. 6B, an intra-chamber electrode assembly 602 includes a first electrode subassembly 622 and a second electrode subassembly 632 configured such that the filaments of the subassemblies 622 and 632 extend at a non-zero angle, e.g., perpendicular, to each other.

The intra-chamber electrode assembly 602 can be driven with RF signals in various ways. In some implementations, the subassembly 622 and subassembly 632 are driven with a same RF signal with respect to an RF ground. In some implementations, the subassembly 622 and subassembly 632 are driven with a differential RF signal. In some implementations, the subassembly 622 is driven with an RF signal, and subassembly 632 is connected to an RF ground.

Referring to FIG. 6C, an intra-chamber electrode assembly 604 includes a first electrode subassembly 624 and a second electrode subassembly 634 that are overlaid. The first electrode subassembly 624 and the second electrode subassembly 634 each has multiple parallel filaments 400 that are connected by buses 660 and 662 in both ends. The first electrode subassembly 624 and the second electrode subassembly 634 are configured such that the filaments of the subassemblies 624 and 634 are parallel to each other, with the filaments of the subassemblies 624, 634 arranged in alternating pattern.

The intra-chamber electrode assembly 604 can be driven with RF signals in various ways. In some implementations, the subassembly 624 and subassembly 634 are driven with a same RF signal with respect to an RF ground. In some implementations, the subassembly 624 and subassembly 634 are driven with a differential RF signal. In some implementations, the subassembly 624 is driven with an RF signal, and the subassembly 634 is connected to an RF ground.

In some implementations, the intra-chamber electrode assembly 604 is driven in a single-ended manner with an RF signal using a center-feed 640. The center-feed 640 is connected to an X-shaped current splitter 642 at the center. The four corners of the subassemblies 624 and 634 are connected to the X-shaped current splitter 642 using vertical feed structures.

In general, differential driving of the subassemblies 620, 622, 624 and the respective subassemblies 630, 632, 634 can improve plasma uniformity or process repeatability when an adequate RF ground cannot be provided (e.g., RF ground through a rotary mercury coupler, brushes, or slip rings).

Particular embodiments of the invention have been described. However, other embodiments are possible. For example:
  The workpiece could be held stationary within the plasma chamber.
  The platform could be moved linearly or rotated such that the workpiece moves in the plasma chamber.

Other embodiments are within the scope of the following claims.

What is claimed is:
1. A plasma reactor comprising:
  a chamber body having an interior space that provides a plasma chamber, wherein the interior space has a ceiling providing a boundary between the interior space and an exterior environment, the ceiling including a top electrode support and an insulating frame provided by the top electrode support or as a separate body, the insulating frame formed of an electrically insulating material;
  a gas distributor to deliver a processing gas to the plasma chamber;
  a pump coupled to the plasma chamber to evacuate the plasma chamber;
  a workpiece support to hold a workpiece;
  an intra-chamber electrode assembly comprising the insulating frame and a filament, the filament including a first portion extending downwardly from the insulating frame at the ceiling and a second portion extending laterally through the plasma chamber between the ceiling and the workpiece support and parallel to the workpiece support, the filament including a conductor at least partially surrounded by an insulating shell and the insulating shell fused to the insulating frame at the ceiling, wherein the insulating frame comprises a downwardly projecting sidewall positioned inward of a sidewall of the chamber body and that laterally surrounds a volume between the ceiling and the second portion of the filament, wherein the downwardly projecting sidewall is composed of a dielectric material; and a first RF power source to supply a first RF power to the conductor of the intra-chamber electrode assembly.

2. The plasma reactor of claim 1, wherein the intra-chamber electrode assembly comprises a plurality of filaments, each filament including a first portion extending downwardly from the ceiling and a second portion extending laterally through the plasma chamber extending laterally through the plasma chamber between the ceiling and the workpiece support.

3. The plasma reactor of claim 2, wherein the second portions of the plurality of filaments are coplanar.

4. The plasma reactor of claim 3, wherein the second portions of the plurality of filaments are uniformly spaced apart.

5. The plasma reactor of claim 3, wherein the second portions of the plurality of filaments are linear.

6. The plasma reactor of claim 1, wherein the downwardly projecting sidewall is formed from silicon oxide or a ceramic material.

7. The plasma reactor of claim 1, wherein the insulating shell and the insulating frame are a same material composition.

8. The plasma reactor of claim 1, wherein the insulating frame is formed from silica, or a ceramic material.

9. A plasma reactor comprising:
a chamber body having an interior space that provides a plasma chamber, wherein the interior space has a ceiling providing a boundary between the interior space and an exterior environment, the ceiling including an insulating support to hold a top electrode at a position in the plasma chamber and an insulating frame provided by the insulating support or as a separate body, the insulating frame extending along a side of the chamber body;

a gas distributor to deliver a processing gas to the plasma chamber;

a pump coupled to the plasma chamber to evacuate the plasma chamber;

a workpiece support to hold a workpiece facing the position for the top electrode;

an intra-chamber electrode assembly comprising a filament, the filament including a first portion extending downwardly from the insulating frame at the ceiling and a second portion extending laterally through the plasma chamber between the position for the top electrode and the workpiece support, the filament including a conductor at least partially surrounded by an insulating shell that extends from the insulating frame and the insulating shell is fused to the insulating frame, wherein the insulating frame comprises a downwardly projecting sidewall positioned inward of a sidewall of the chamber body and that laterally surrounds a volume between the ceiling and the second portion of the filament, wherein the downwardly projecting sidewall is composed of a dielectric material; and a first RF power source to supply a first RF power to the conductor of the intra-chamber electrode assembly.

10. The plasma reactor of claim 9, comprising the top electrode arranged at the position.

11. The plasma reactor of claim 10, wherein the top electrode is formed from silicon, carbon, or a combination thereof.

12. The plasma reactor of claim 9, wherein the insulating frame is an oxide, nitride, or a combination thereof.

13. The plasma reactor of claim 12, wherein the insulating frame is formed from silicon oxide, aluminum oxide, or silicon nitride.

14. The plasma reactor of claim 2, wherein shells of the plurality of filaments are separately fused to the insulating frame at the ceiling.

15. The plasma reactor of claim 1, wherein the chamber body is composed of a conducting material.

16. The plasma reactor of claim 1, wherein the downwardly projecting sidewall projects past the second portion of the filament.

17. The plasma reactor of claim 1, wherein the sidewall forms a fluid-tight seal with the insulating frame.

* * * * *